(12) United States Patent
Jedhe et al.

(10) Patent No.: US 12,327,602 B2
(45) Date of Patent: Jun. 10, 2025

(54) REDUCING PRECHARGE POWER CONSUMPTION IN A MEMORY ARRAY

(71) Applicant: MediaTek Inc., Hsin-Chu (TW)

(72) Inventors: Gajanan Sahebrao Jedhe, San Jose, CA (US); Chetan Deshpande, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 73 days.

(21) Appl. No.: 18/175,511

(22) Filed: Feb. 27, 2023

(65) Prior Publication Data
US 2023/0307017 A1    Sep. 28, 2023

Related U.S. Application Data

(60) Provisional application No. 63/322,251, filed on Mar. 22, 2022.

(51) Int. Cl.
*G11C 7/10* (2006.01)
*G11C 15/04* (2006.01)

(52) U.S. Cl.
CPC ............ *G11C 7/1048* (2013.01); *G11C 7/109* (2013.01); *G11C 15/04* (2013.01)

(58) Field of Classification Search
CPC ........ G11C 7/1048; G11C 7/109; G11C 15/04
See application file for complete search history.

(56) References Cited

U.S. PATENT DOCUMENTS

| | | |
|---|---|---|
| 6,005,813 A | 12/1999 | Waller |
| 7,355,873 B2 | 4/2008 | Nii |
| 9,286,980 B2 | 3/2016 | Arsovski |
| 9,543,015 B1 | 1/2017 | Roy |
| 9,564,184 B2 | 2/2017 | Barth, Jr. |
| 10,534,839 B2 | 1/2020 | Hsieh |
| 10,621,489 B2 | 4/2020 | Appuswamy |
| 11,018,687 B1 | 5/2021 | Srivastava et al. |
| 11,049,013 B1 | 6/2021 | Duong |
| 2015/0131383 A1 | 5/2015 | Akerib |
| 2016/0225437 A1 | 8/2016 | Kumar et al. |
| 2019/0102671 A1 | 4/2019 | Cohen |
| 2019/0103156 A1 | 4/2019 | Sumbul et al. |
| 2020/0258569 A1 | 8/2020 | Jaiswal |
| 2020/0301668 A1 | 9/2020 | Li |
| 2020/0403616 A1 | 12/2020 | Shu |
| 2021/0012202 A1 | 1/2021 | Venkatesh |
| 2021/0027815 A1 | 1/2021 | Shu |
| 2021/0240442 A1* | 8/2021 | Srivastava ............ G11C 11/412 |
| 2021/0350846 A1* | 11/2021 | Rios ..................... G11C 7/1075 |
| 2022/0044714 A1* | 2/2022 | Chang ...................... G11C 7/12 |

(Continued)

FOREIGN PATENT DOCUMENTS

WO    2019/246064 A1    12/2019

OTHER PUBLICATIONS

EP 23162966.8, Jul. 19, 2023, Extended European Search Report.

(Continued)

*Primary Examiner* — Han Yang
(74) *Attorney, Agent, or Firm* — Winston Hsu

(57) ABSTRACT

An output node of a cell of a memory device is precharged based on an activation input for the cell. A memory device includes precharge circuitry configured to precharge an output node of a cell of the memory device based on an activation input for the cell.

20 Claims, 5 Drawing Sheets

(56) References Cited

U.S. PATENT DOCUMENTS

2022/0301605 A1\* 9/2022 Mirhaj .................... G11C 7/12
2022/0328099 A1 10/2022 Deshpande
2023/0022347 A1 1/2023 Deshpande

OTHER PUBLICATIONS

Extended European Search Report for European Application No. 23162966.8 dated Jul. 19, 2023.
Jinshan Yue et al., "A 65nm Computing-in-Memory-Based CNN Processor with 2.9-to-35.8TOPS/W System Energy Efficiency Using Dynamic-Sparsity Performance-Scaling Architecture and Energy-Efficient Inter/Intra-Macro Data Reuse", ISSCC 2020 / Session 14 / Low-Power Machine Learning / 14.3, Feb. 18, 2020, XP033754392, pp. 234~236, 2020 IEEE International Solid-State Circuits Conference. ,Feb. 18, 2020.

\* cited by examiner

REDUCING PRECHARGE POWER CONSUMPTION IN A MEMORY ARRAY

CROSS-REFERENCE TO RELATED APPLICATIONS

This application claims priority to and the benefit of U.S. Provisional Application Ser. No. 63/322,251, filed Mar. 22, 2022 and entitled "METHOD AND APPARATUS FOR LOW POWER MULTIPLY AND ACCUMULATE (MAC) OPERATION IN A MEMORY ARRAY," which is hereby incorporated herein by reference in its entirety.

BACKGROUND

In conventional computing devices, a memory functional block is separate from a processor functional block. Data is fetched from the memory to perform operations in the processor functional block.

Compute-in-memory (CIM) devices are devices in which operations may be performed in the memory. Such architectures may have the benefit of improved speed or lower power consumption. One example of an application for CIM devices is an implementing neural networks. Neural networks make extensive use of multiply accumulate operations, in which inputs are multiplied by filter weights and the products are summed. CIM devices may include hardware for performing the multiply and accumulate operations as well as memory cells for storing the filter weights.

SUMMARY

Some aspects relate to a method of operating a memory device, the method comprising precharging an output node of a cell of the memory device based on an activation input for the cell.

Some aspects relate to a memory device comprising precharge circuitry configured to precharge an output node of a cell of the memory device based on an activation input for the cell.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

The devices and techniques described herein allow for reducing the power consumption in a memory array due to precharge operations. The inventors have recognized and appreciated that conventional techniques for precharging an output node of a cell cause frequent switching of a precharge device connected to the output node, which may lead to high power consumption due to frequent charging and discharging of the gate capacitance of the precharge device. The power consumption can be reduced by switching the precharge device less frequently. In some embodiments, a precharge operation for a memory cell may be triggered by an activation input corresponding to the memory cell. Since the activation signal changes values relatively infrequently, the precharge device may be switched less frequently, and the power consumption caused by precharge may be reduced. Such techniques may be used in a compute-in-memory (CIM) device or other devices having a memory array.

Figure 1:
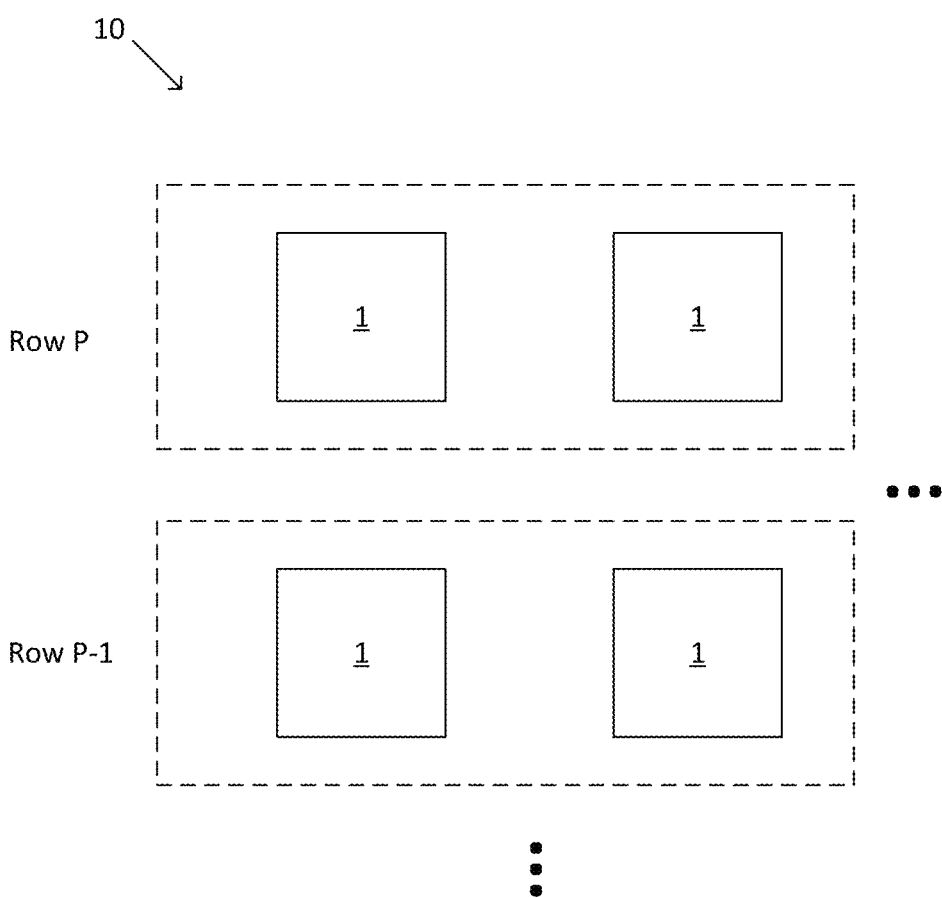
FIG. 1 illustrates a high-level block diagram of a compute-in-memory (CIM) device having an array of CIM cells arranged in rows and columns.

FIG. 1 illustrates a high-level block diagram of a compute-in-memory (CIM) device 10 having an array of CIM cells 1 arranged in rows and columns. The CIM device 10 may have any number of rows and columns. Each CIM cell 1 has at least one memory cell and associated calculation circuitry, as discussed further below. The output node of the calculation circuitry needs to be precharged before performing a compute operation.

Figure 2:
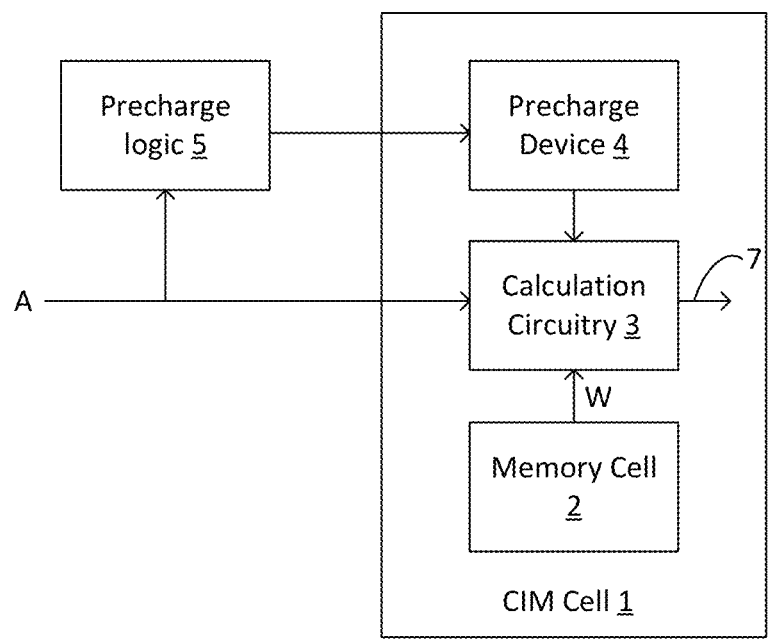
FIG. 2 is a block diagram showing functional circuit blocks of a CIM cell and functional circuit blocks that provide signals to a CIM cell.

FIG. 2 is a block diagram showing functional circuit blocks of a CIM cell 1, according to some embodiments. The CIM cell 1 includes a memory cell 2, calculation circuitry 3 that performs calculations based on an activation input A and the value W stored in the memory cell, and a precharge device 4 that precharges an output node of the calculation circuitry 3. Precharge logic 5 may control the precharge device 4 to precharge the output node 7 of the calculation circuitry 3 with a suitable timing. In some embodiments, the precharge device 4 may be turned on (conductive) in response to the activation input A. After the precharge operation, the precharge device 4 is turned off (non-conductive). The calculation circuitry 3 is then ready to perform a calculation using the input A and the value W stored in the memory cell 2 when the CIM device 10 performs a compute operation. When the CIM device 10 controls calculation circuitry 3 to perform a compute operation, the result of the calculation is provided to output node 7. The memory cell 2 may be any suitable type of memory cell, such as a static random access memory (SRAM) cell or a ternary content addressable memory (TCAM) cell, for example.

Figure 3:
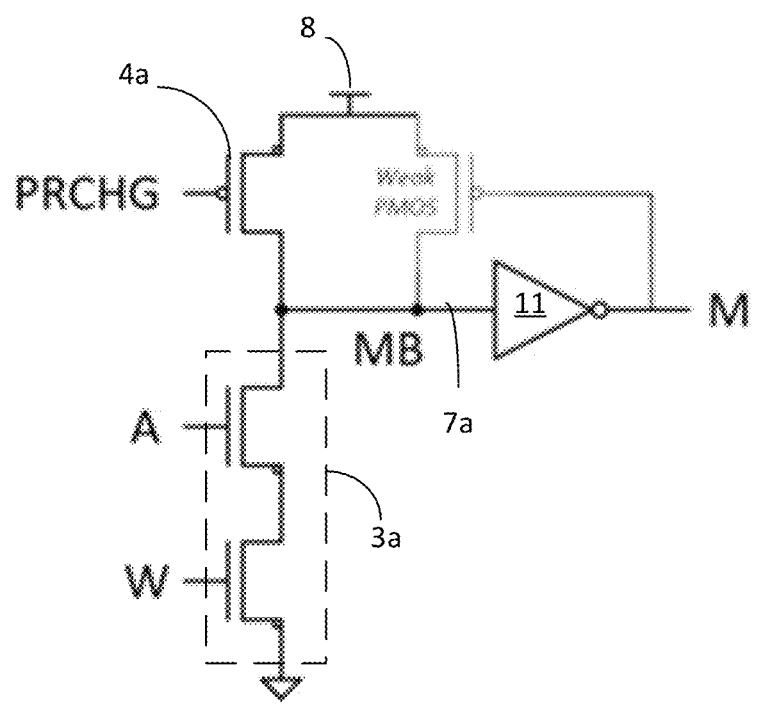
FIG. 3 shows additional detail of one example of a CIM cell in which calculation circuitry is configured to perform multiplication of the input A and value W stored in a memory cell.

FIG. 3 shows additional detail of one example of a CIM cell according to some embodiments. In this example, the calculation circuitry 3a is configured to perform multiplication of the activation input A and value W stored in the memory cell 2. The precharge logic 5 provides a signal PRCHG that controls precharge device 4a to precharge the output node 7a, also shown as node MB. The precharge device 4a may be a PMOS transistor that is controlled to perform the precharge operation in response to signal PRCHG having a low logic level. During the precharge operation the precharge device 4a is conductive, and connects output node 7a to the power rail 8. The CIM cell 1 may include an inverter 11 that inverts signal MB to produce signal M. Signal M may be provided to an adder tree to perform the addition portion of a multiply-accumulate calculation. When a compute operation is performed the input A is multiplied by the value W stored in the memory cell 2. Values A and W may be digital values. If both A and W are logic high, the output node 7a is pulled down to ground (logic low). If either A or W or both are logic low, the output node 7a is not pulled down to ground and instead remains at the precharge voltage (logic high, in this example). The CIM cell 1 may include circuitry for maintaining MB at a high logic level when the precharge device is off and either A or W or both has a low logic level: in this example a weak PMOS device performs this function.

Figures 4A, 4B:
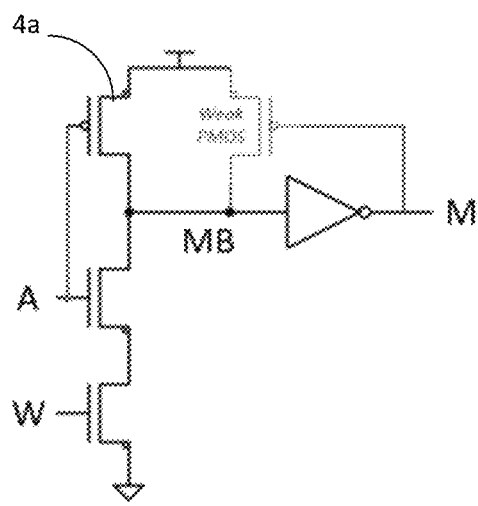
FIG. 4A-4C show an embodiment for performing precharge based on an activation input.
Figure 4C:
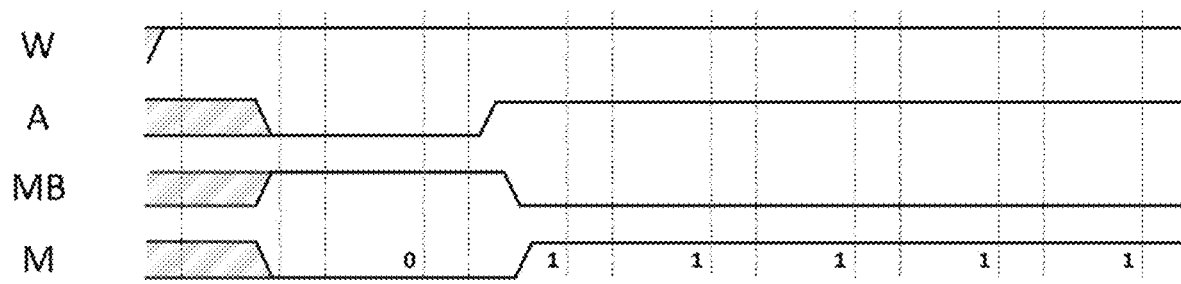

FIG. 4A shows a circuit diagram of an embodiment of a CIM cell in which the gate of the precharge device 4a is connected to the activation input A. As shown in the truth table of FIG. 4B, when the activation input A has a logic value of zero the precharge device 4a turns on and precharges node MB to the voltage of the power rail 8. FIG. 4C shows a timing diagram illustrating an activation input A having a low logic value causing MB to be precharged to a high logic value. When a compute operation is performed and both A and W have high logic values, the node MB is pulled down to a low logic value.

Figure 5A:
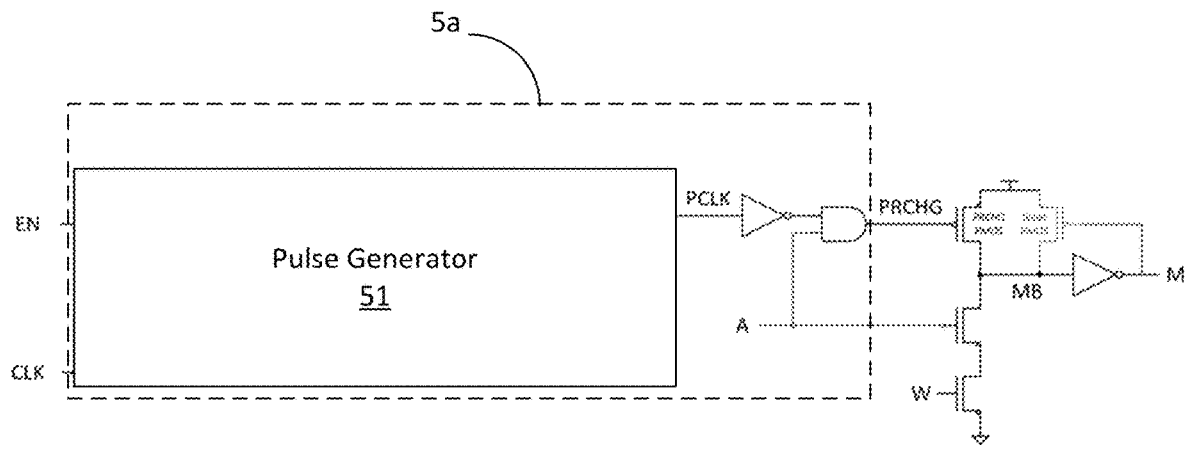
FIGS. 5A-5B show an embodiment for performing precharge based on an activation input.
Figure 5B:
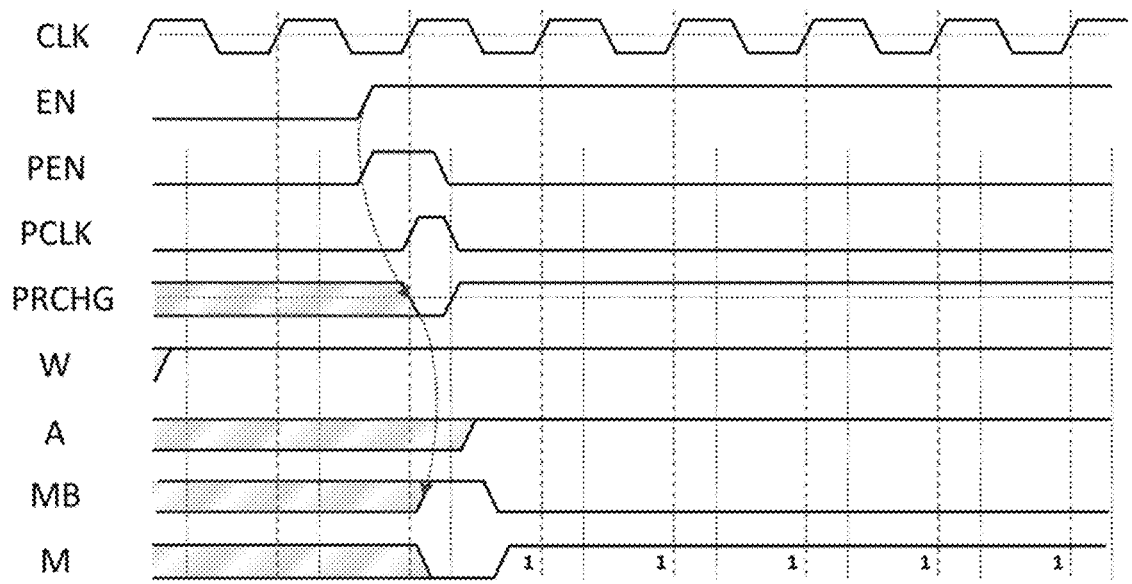

FIG. 5A shows a diagram of another embodiment in which precharge logic 5a produces a precharge signal PRCHG in response to the activation input A. The precharge logic 5a includes a pulse generator 51 and other logic circuitry. With the precharge logic 5, the precharge operation can be initiated either by logic signal A having a low logic level or in response to a pulse signal PCLK produce in response to an enable signal EN. FIG. 5B shows a timing diagram illustrating the signals shown in FIG. 5A, with signal PEN being an internal signal of the pulse generator 51. In some embodiments, the enable signal EN may transition from a low logic level to a high logic level when a compute operation is enabled in the CIM device 10. In response, the pulse generator 51 may produce a pulse that causes an initial precharge operation to be performed.

Figure 6:
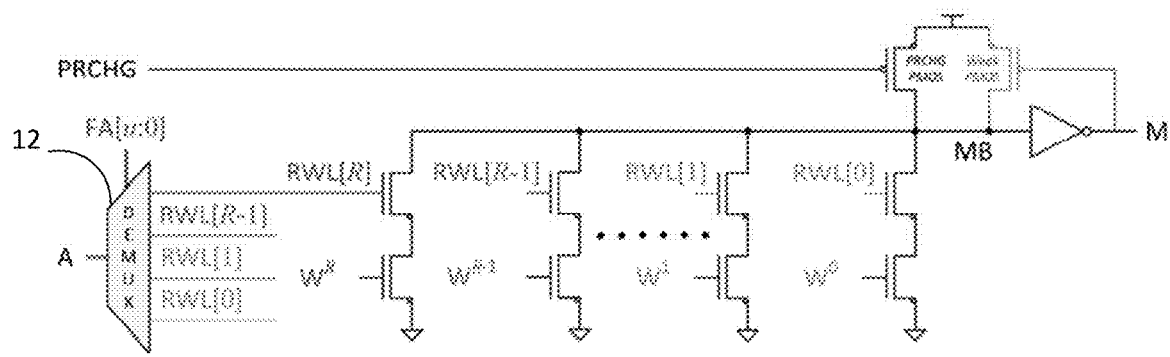
FIG. 6 illustrates that a CIM cell 1 may have a plurality of memory cells storing respective weights W and a demultiplexer 12 that provides the input A to a transistor gate of a selected multiplier path corresponding to the selected weight W.

FIG. 6 illustrates that a CIM cell may have a plurality of memory cells storing respective weights W and a demultiplexer 12 that provides the input A to a transistor gate of a selected multiplier path corresponding to the selected weight W. The selection signal FA[u:0] is the selection signal of the demultiplexer, which determines which filter weight W is selected, and applies the activation signal A to the gate of the transistor RWL corresponding to the selected weight W.

Figure 7:
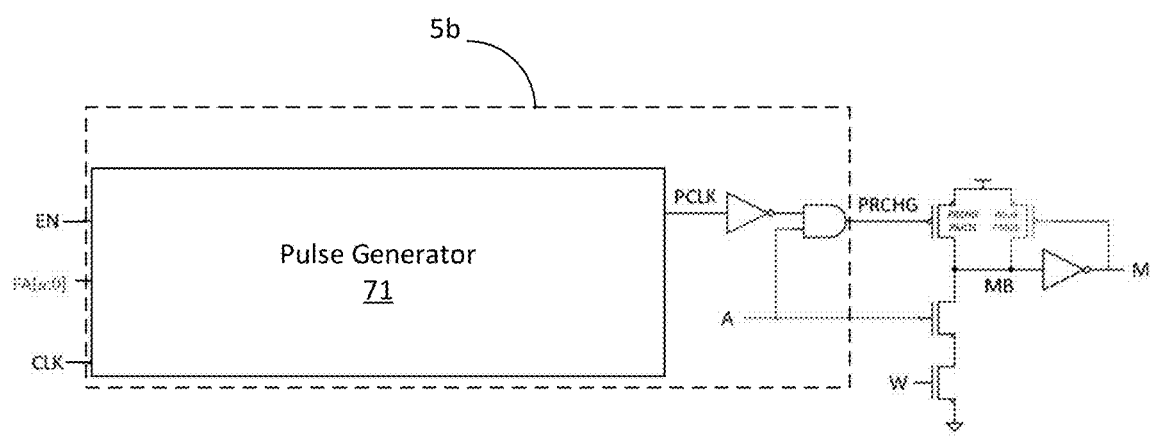
FIG. 7 shows an example of precharge logic including a pulse generator configured to produce a pulse to initiate precharge in response to a change in any one or more of a plurality of input signals.

In some embodiments, the precharge operation may be triggered in response to a change in the selection signal FA[u:0]. To do so, the enable signal EN of the precharge logic 5a may be the selection signal FA[u:0]. Alternatively or additionally, the precharge operation may be triggered in response to a change in any one of a plurality of signals, such as enable signal EN that switches to a logic high when a compute operation is enabled in the CIM device 10, and FA[u:0]. The precharge logic 5 may activate the precharge operation in response to a change in any of such signals. FIG. 7 shows an example of such precharge logic as precharge logic 5b, which includes a pulse generator 71 configured to produce a pulse to initiate precharge in response to a change in either enable signal EN or selection signal FA[u:0].

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A method of operating a memory device, the method comprising:
   precharging an output node of a cell of the memory device based on an activation input for the cell, wherein the activation input controls whether to enable precharging of the output node.

2. The method of claim 1, wherein the precharging is performed when the activation input has a first logic level.

3. The method of claim 1, wherein the precharging is performed through coupling the output node to a power rail using a transistor.

4. The method of claim 3, wherein the transistor comprises a PMOS transistor.

5. The method of claim 1, wherein the memory device is a compute-in-memory device and the cell comprises a memory cell and calculation circuitry configured to perform a calculation based on the activation input and a value stored in the memory cell.

6. The method of claim 5, wherein the calculation comprises multiplication.

7. The method of claim 1, further comprising precharging the output node in response to an enable signal.

8. The method of claim 7, further comprising producing a pulse in response to a change in the enable signal.

9. The method of claim 1, wherein the cell stores a plurality of filter weights that are selectable based on a selection signal, and the method further comprises precharging the output node in response to a change in the selection signal.

10. The method of claim 1, wherein the cell includes a static random access memory (SRAM) cell and/or a ternary content addressable memory (TCAM) cell.

11. A memory device comprising:
    precharge circuitry configured to precharge an output node of a cell of the memory device based on an activation input for the cell, wherein the activation input controls whether to enable the precharge circuitry to precharge the output node.

12. The memory device of claim 11, wherein the precharge circuitry precharges the output node when the activation input has a first logic level.

13. The memory device of claim 11, wherein the precharge circuitry comprises a transistor configured to couple the output node to a power rail.

14. The memory device of claim 13, wherein the transistor comprises a PMOS transistor.

15. The memory device of claim 11, wherein the memory device is a compute-in-memory device and the cell comprises a memory cell and calculation circuitry configured to perform a calculation based on the activation input and a value stored in the memory cell.

16. The memory device of claim 15, wherein the calculation comprises multiplication.

17. The memory device of claim 11, wherein the precharge circuitry is configured to precharge the output node in response to an enable signal.

18. The memory device of claim 11, wherein the precharge circuitry comprises a pulse generator.

19. The memory device of claim 11, wherein the cell stores a plurality of filter weights that are selectable based on a selection signal, and the precharge circuitry is configured to precharge the output node in response to a change in the selection signal.

20. The memory device of claim 11, wherein the cell includes a static random access memory (SRAM) cell and/or a ternary content addressable memory (TCAM) cell.

* * * * *